(12) United States Patent
Cheng

(10) Patent No.: US 11,895,773 B2
(45) Date of Patent: *Feb. 6, 2024

(54) CIRCUIT BOARD STRUCTURE

(71) Applicant: Unimicron Technology Corp., Taoyuan (TW)

(72) Inventor: Shih-Lian Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 1 day.

This patent is subject to a terminal disclaimer.

(21) Appl. No.: 17/853,933

(22) Filed: Jun. 30, 2022

(65) Prior Publication Data

US 2023/0156918 A1 May 18, 2023

Related U.S. Application Data

(60) Provisional application No. 63/279,661, filed on Nov. 15, 2021.

(30) Foreign Application Priority Data

Jun. 1, 2022 (TW) ................................ 111120375

(51) Int. Cl.
H05K 1/11 (2006.01)
H05K 1/02 (2006.01)
H05K 3/46 (2006.01)

(52) U.S. Cl.
CPC .......... *H05K 1/116* (2013.01); *H05K 1/0222* (2013.01); *H05K 2201/0195* (2013.01); *H05K 2201/09509* (2013.01)

(58) Field of Classification Search
CPC .... H05K 1/0222; H05K 1/0221; H05K 1/024; H05K 1/144; H05K 1/116; H05K 1/0251;
(Continued)

(56) References Cited

U.S. PATENT DOCUMENTS 9,635,761 B2 4/2017 Brigham et al.
9,736,941 B1 * 8/2017 Kunimoto ................ H05K 1/05
(Continued)

FOREIGN PATENT DOCUMENTS

CN 100367832 2/2008
CN 111316434 6/2020
(Continued)

*Primary Examiner* — Hoa C Nguyen
*Assistant Examiner* — Amol H Patel
(74) *Attorney, Agent, or Firm* — JCIPRNET

(57) ABSTRACT

A circuit board structure includes a substrate, a third dielectric layer, a fourth dielectric layer, a first external circuit layer, a second external circuit layer, a conductive through hole, a first annular retaining wall, and a second annular retaining wall. The conductive through hole penetrates through the third dielectric layer, a second dielectric layer, and the fourth dielectric layer. The conductive through hole is electrically connected to the first external circuit layer and the second external circuit layer. The first annular retaining wall is disposed in the third dielectric layer, surrounds the conductive through hole, and is electrically connected to the first external circuit layer and the first inner circuit layer. The second annular retaining wall is disposed in the fourth dielectric layer, surrounds the conductive through hole, and connects to the second external circuit layer and the second inner circuit layer electrically.

11 Claims, 22 Drawing Sheets

(58) Field of Classification Search
CPC . H05K 2201/0959; H05K 2201/09672; H05K 2201/098; H05K 3/4644; H01L 23/49822; H01L 23/49833
See application file for complete search history.

(56) References Cited

U.S. PATENT DOCUMENTS

| | | | | |
|---|---|---|---|---|
| 2007/0230150 | A1* | 10/2007 | Castriotta | H01L 23/49827 257/E23.079 |
| 2008/0218985 | A1* | 9/2008 | Takeda | H05K 1/0222 361/768 |
| 2009/0056998 | A1* | 3/2009 | Booth, Jr. | H05K 3/429 174/262 |
| 2009/0200682 | A1* | 8/2009 | Zhang | H01L 21/486 174/266 |
| 2010/0163295 | A1* | 7/2010 | Roy | H01L 21/76877 174/262 |
| 2011/0209911 | A1* | 9/2011 | Ishida | H05K 1/0251 174/264 |
| 2015/0181693 | A1* | 6/2015 | Wu | H05K 1/0222 174/262 |
| 2022/0346230 | A1* | 10/2022 | Seo | H05K 1/0251 |
| 2023/0053198 | A1* | 2/2023 | Skaltsounis | G16H 50/30 |
| 2023/0063808 | A1* | 3/2023 | Shahidi | H05K 3/0094 |

FOREIGN PATENT DOCUMENTS

| | | |
|---|---|---|
| TW | 201220967 | 5/2012 |
| TW | I528871 | 4/2016 |

* cited by examiner

CIRCUIT BOARD STRUCTURE

CROSS-REFERENCE TO RELATED APPLICATION

This application claims the priority benefit of U.S. provisional application Ser. No. 63/279,661, filed on Nov. 15, 2021, and Taiwan application serial no. 111120375, filed on Jun. 1, 2022. The entirety of each of the patent applications is hereby incorporated by reference herein.

BACKGROUND

Technical Field

The present disclosure relates to a substrate structure, particularly to a circuit board structure.

Description of Related Art

The design of coaxial vias in a conventional circuit board requires one or more insulating layers between the inner conductor layer and the outer conductor layer. As these insulating layers are formed by pressing build-up layers, impedance may mismatch at both ends of the coaxial via, and the electromagnetic interference (EMI) would also shield gaps, compromising the integrity of high-frequency signals.

SUMMARY

The disclosure provides a circuit board structure capable of preventing energy loss and reducing noise interference effectively to provide better signal integrity.

The circuit board structure of the disclosure includes a substrate, a third dielectric layer, a fourth dielectric layer, a first external circuit layer, a second external circuit layer, a conductive through hole, a first annular retaining wall, and a second annular retaining wall. The substrate has an opening and includes a first dielectric layer, a second dielectric layer, a first inner circuit layer, a second inner circuit layer, and a conductive connection layer. The opening penetrates through the first dielectric layer. The first dielectric layer has a first surface and a second surface opposite to each other. The first inner circuit layer is disposed on the first surface, and the second inner circuit layer is disposed on the second surface. The conductive connection layer covers the inner wall of the opening and connects the first inner circuit layer and the second inner circuit layer. The second dielectric layer fills the opening, and the second dielectric layer has a third surface and a fourth surface opposite to each other. The third dielectric layer covers the first inner circuit layer and the third surface. The fourth dielectric layer covers the second inner circuit layer and the fourth surface. The first external circuit layer is disposed on the third dielectric layer. The second external circuit layer is disposed on the fourth dielectric layer. The conductive through hole penetrates through the third dielectric layer, the second dielectric layer, and the fourth dielectric layer, and connects the first external circuit layer and the second external circuit layer electrically. The first annular retaining wall is disposed in the third dielectric layer, surrounds the conductive through hole, and connects the first external circuit layer and the first inner circuit layer electrically. The second annular retaining wall is disposed in the fourth dielectric layer, surrounds the conductive through hole, and connects the second external circuit layer and the second inner circuit layer electrically.

The circuit board structure of the disclosure includes a first substrate, a second substrate, a third dielectric layer, a fourth dielectric layer, a first annular retaining wall, and a second annular retaining wall. The first substrate includes a first dielectric layer, a first external circuit layer, a first conductive through hole, and a first inner circuit layer. The first external circuit layer and the first inner circuit layer are respectively located on opposite sides of the first dielectric layer. The first conductive through hole penetrates through the first dielectric layer and connects the first external circuit layer and the first inner circuit layer electrically. The second substrate includes a second dielectric layer, a second external circuit layer, a second conductive through hole, and a second inner circuit layer. The second external circuit layer and the second inner circuit layer are respectively located on opposite sides of the second dielectric layer. The second conductive through hole penetrates through the second dielectric layer and connects the second external circuit layer and the second inner circuit layer electrically. The third dielectric layer covers the first inner circuit layer. The fourth dielectric layer covers the second inner circuit layer. The first annular retaining wall is disposed in the third dielectric layer and is electrically connected to the first internal circuit layer. The orthographic projection of the first annular retaining wall on the first substrate surrounds the first conductive through hole. The second annular retaining wall is disposed in the fourth dielectric layer and is electrically connected to the second inner circuit layer. The orthographic projection of the second annular retaining wall on the second substrate surrounds the second conductive through hole. The third dielectric layer is connected to the fourth dielectric layer, and part of the first annular retaining wall is connected to part of the second annular retaining wall, such that the first substrate is butted to the second substrate.

Based on the above, in the design of the circuit board structure of the disclosure, the annular retaining wall surrounds the conductive through hole, and the annular retaining wall as a closed boundary structure is able to reduce the electromagnetic interference (EMI) and cover the signal of the conductive through hole completely. Compared with the prior art with single-row blind vias with gaps around the conductive through hole, the circuit board structures of the disclosure is able to prevent energy loss and reduce noise interference effectively to provide better signal integrity.

To make the above features and advantages of the disclosure to be understood easily, the following embodiments are described in detail with reference to the following drawings.

DESCRIPTION OF THE EMBODIMENTS

Figure 1A:
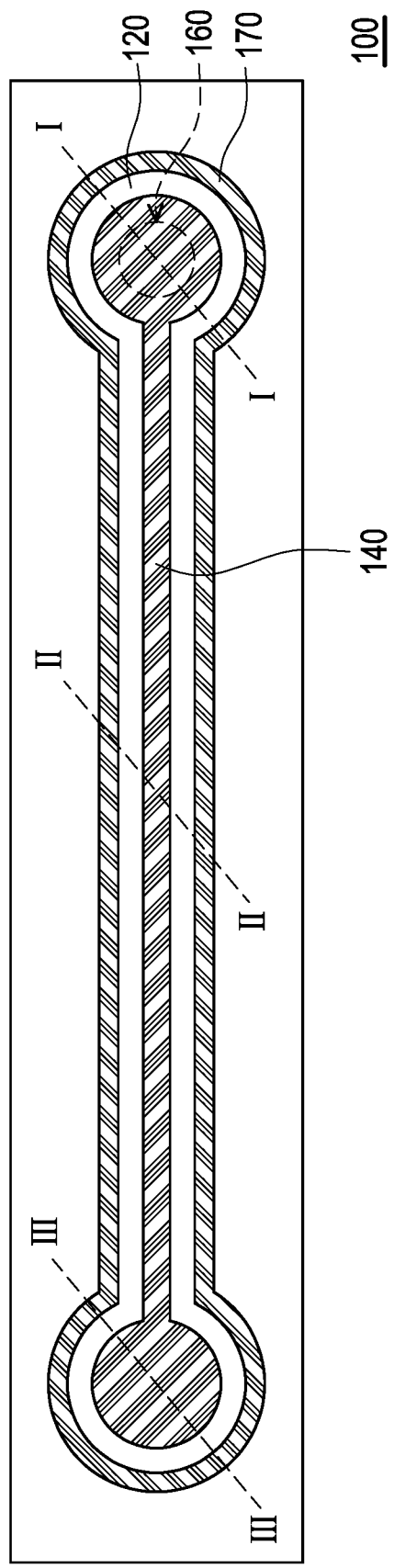
FIG. 1A is a schematic top view of a circuit board structure according to an embodiment of the disclosure.
Figure 1B:
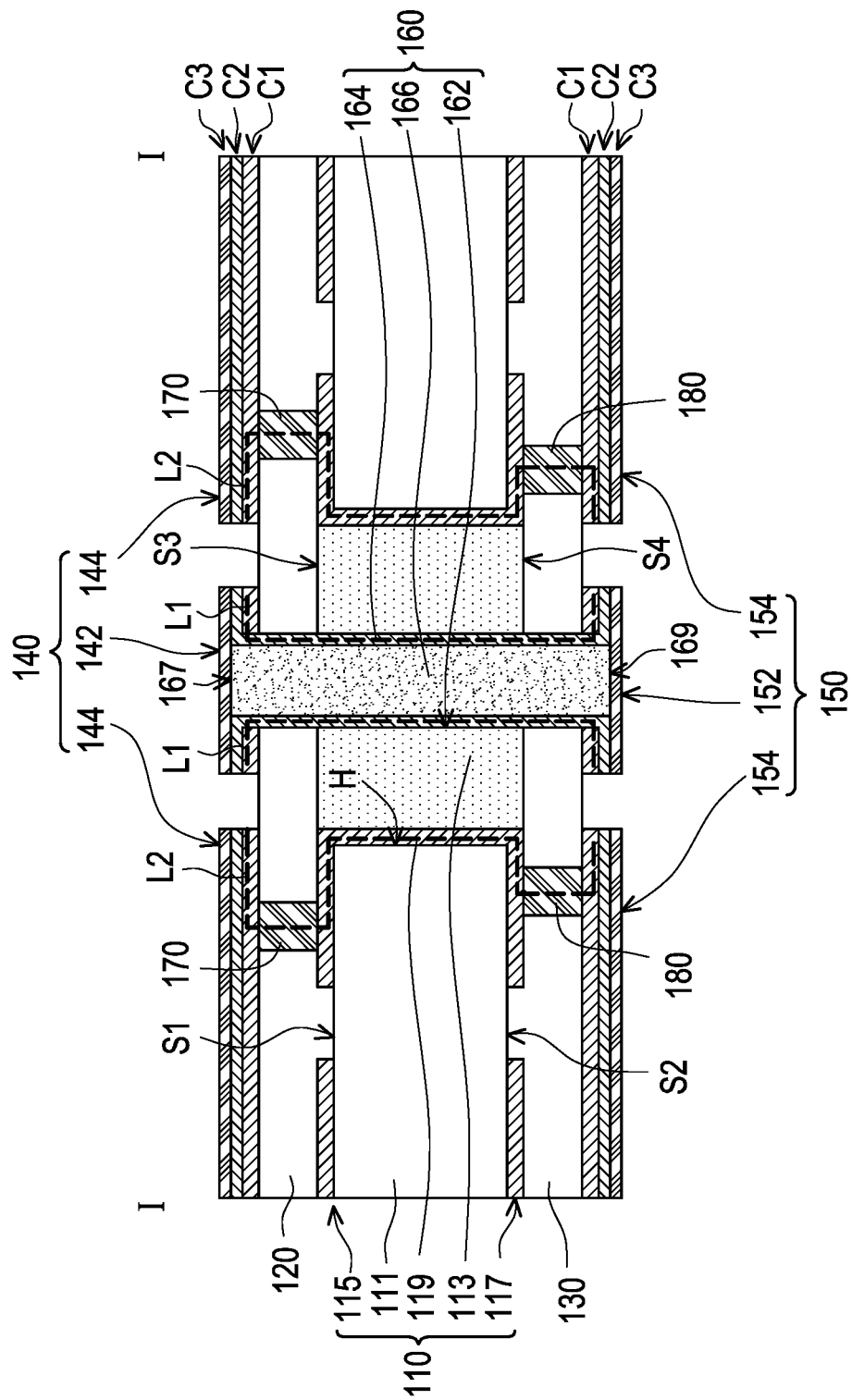
FIG. 1B is a schematic cross-sectional view along line I-I in FIG. 1A.
Figure 1C:
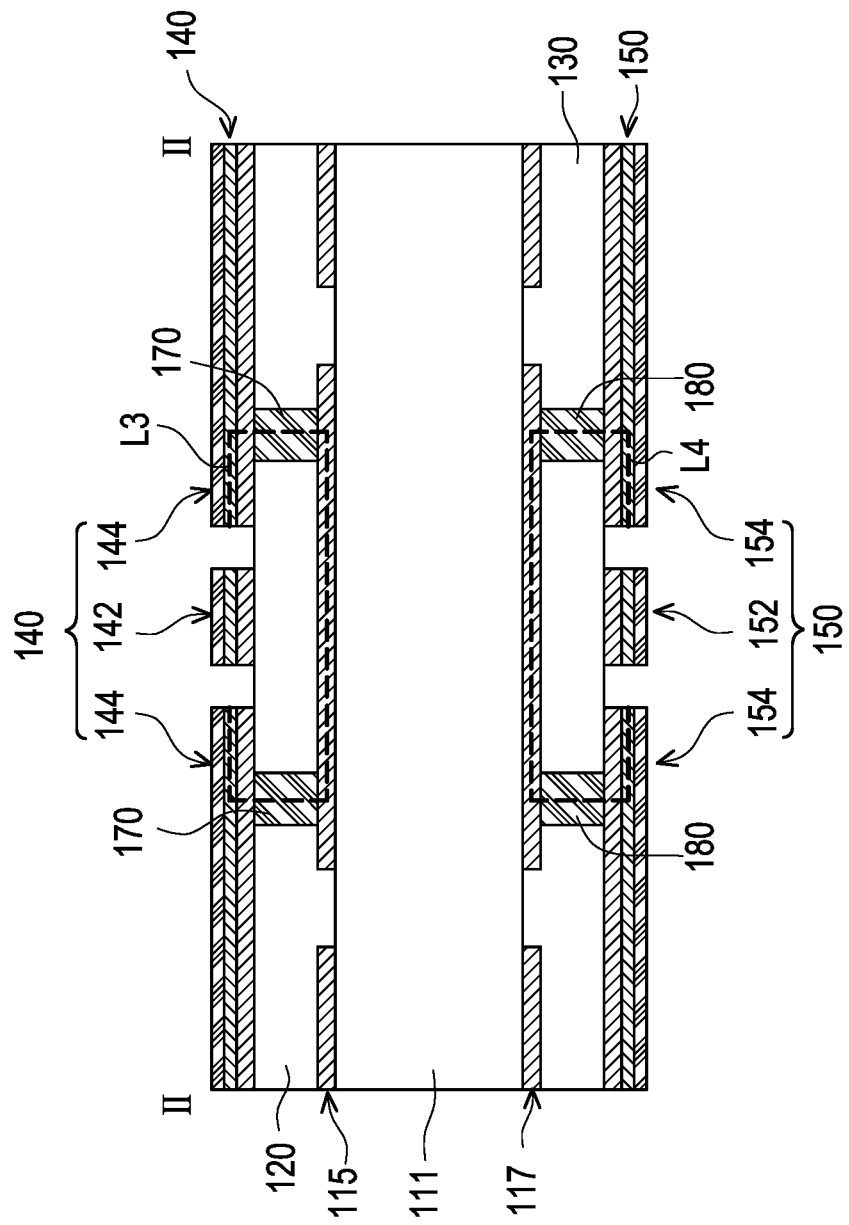
FIG. 1C is a schematic cross-sectional view along line II-II in FIG. 1A.
Figure 1D:
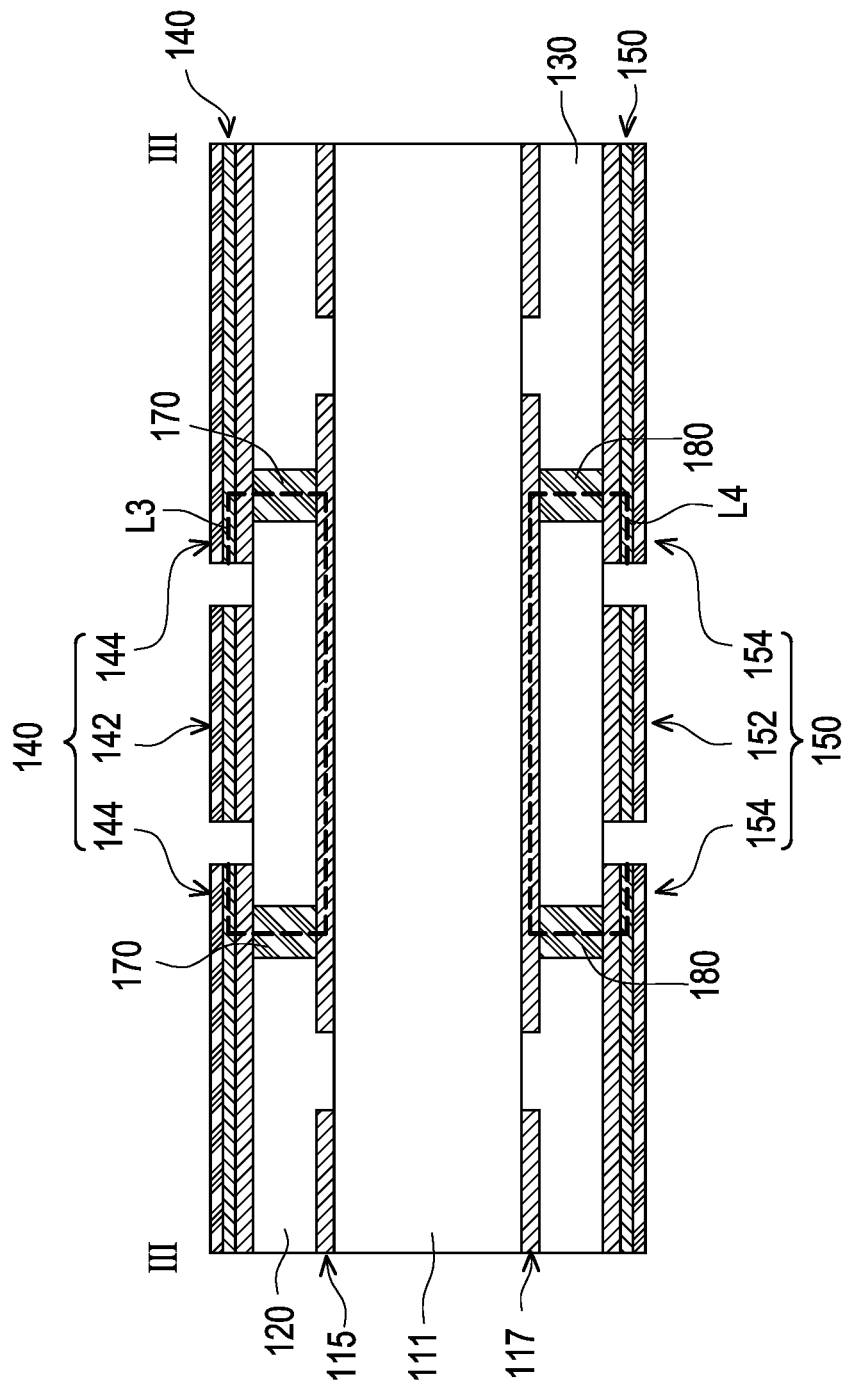
FIG. 1D is a schematic cross-sectional view along line III-III in FIG. 1A.

FIG. 1A is a schematic top view of a circuit board structure according to an embodiment of the disclosure. FIG. 1B is a schematic cross-sectional view along line I-I in FIG. 1A. FIG. 1C is a schematic cross-sectional view along line II-II in FIG. 1A. FIG. 1D is a schematic cross-sectional view along line III-III in FIG. 1A. Please refer to FIG. 1A, FIG. 1B, FIG. 1C, and FIG. 1D at the same time. In this embodiment, the circuit board structure 100 includes a substrate 110, a third dielectric layer 120, a fourth dielectric layer 130, a first external circuit layer 140, a second external circuit layer 150, a conductive through hole 160, a first annular retaining wall 170, and a second annular retaining wall 180.

Specifically, in this embodiment, the substrate 110 has an opening H and includes a first dielectric layer 111, a second dielectric layer 113, a first inner circuit layer 115, a second inner circuit layer 117, and a conductive connection layer 119. The opening H penetrates through the first dielectric layer 111, and the first dielectric layer 111 has a first surface S1 and a second surface S2 opposite to each other. The first inner circuit layer 115 is disposed on the first surface S1 of the first dielectric layer 111, and the second inner circuit layer 117 is disposed on the second surface S2 of the first dielectric layer 111. The conductive connection layer 119 covers the inner wall of the opening H and connects the first inner circuit layer 115 and the second inner circuit layer 117. The second dielectric layer 113 fills the opening H, and the second dielectric layer 113 has a third surface S3 and a fourth surface S4 opposite to each other. The third surface S3 and the fourth surface S4 are respectively aligned with the first inner circuit layer 115 and the second inner circuit layer 117. Here, the first dielectric layer 111 may include general dielectric materials, and the dielectric constant of the first dielectric layer 111 may be lower than 4.0, whereas the dielectric loss (DO of the first dielectric layer 111 may be lower than 0.01, thereby providing suitable impedance matching. The dielectric constant of the second dielectric layer 113 may be lower than 5.0, and the dielectric loss (DO of the second dielectric layer 113 is greater than 0 and less than 0.025, so as to provide proper insulation and impedance matching, and the dielectric loss may also be reduced.

Furthermore, the third dielectric layer 120 of this embodiment covers the first inner circuit layer 115 and the third surface S3 of the second dielectric layer 113. The fourth dielectric layer 130 covers the second inner circuit layer 117 and the fourth surface S4 of the second dielectric layer 113. The first external circuit layer 140 is disposed on the third dielectric layer 120, and the second external circuit layer 150 is disposed on the fourth dielectric layer 130. The conductive through hole 160 penetrates through the third dielectric layer 120, the second dielectric layer 113, and the fourth dielectric layer 130, connecting the first external circuit layer 140 and the second external circuit layer 150 electrically. The conductive through hole 160 includes a via 162, a conductive material layer 164, and a hole-filling material 166. The via 162 penetrates through the third dielectric layer 120, the second dielectric layer 113, and the fourth dielectric layer 130. The conductive material layer 164 covers the inner wall of the via 162 and connects the first external circuit layer 140 and the second external circuit layer 150 electrically. The hole-filling material 166 fills the via 162, and the first external circuit layer 140 and the second external circuit layer 150 respectively cover an upper surface 167 and an opposing lower surface 169 of the hole-filling material 166. Here, the first external circuit layer 140 and the second external circuit layer 150 are multi-layer structural layers, which respectively include a copper foil layer C1, a copper-plated layer C2, and a cover layer C3. The copper-plated layer C2 is located between the copper foil layer C1 and the cover layer C3, and the copper-plated layer C2 and the conductive material layer 164 belong to the same film layer. The cover layer C3 is, for example, but not limited to, a copper layer, and the cover layer C3 covers the upper surface 167 and the lower surface 169 of the hole-filling material 166.

In particular, in this embodiment, the first annular retaining wall 170 is embedded in the third dielectric layer 120, surrounds the conductive through hole 160, and connects the first external circuit layer 140 and the first inner circuit layer 115 electrically. The second annular retaining wall 180 is embedded in the fourth dielectric layer 130, surrounds the conductive through hole 160, and connects the second external circuit layer 150 and the second inner circuit layer 117 electrically. The first external circuit layer 140, the conductive through hole 160, and the second external circuit layer 150 define a signal path L1. The first external circuit layer 150, the first annular retaining wall 170, the first inner circuit layer 115, the connection layer 119, the second inner circuit layer 117, the second annular retaining wall 180, and the second external circuit layer 150 define a ground path L2, and the ground path L2 surrounds the signal path L1.

Furthermore, in FIG. 1B, the first external circuit layer 140 includes a first signal circuit 142 and a first ground circuit 144. The second external circuit layer 150 includes a second signal circuit 152 and a second ground circuit 154.

The first signal circuit 142, the conductive through hole 160, and the second signal circuit 152 define a signal path L1. The first ground circuit 144, the first annular retaining wall 170, the first inner circuit layer 115, the conductive connection layer 119, the second inner circuit layer 117, the second annular retaining wall 180, and the second ground circuit 154 define a ground path L2. As the signal path L1 is surrounded by the ground path L2 in an enclosed manner, a high-frequency, high-speed loop is well formed.

In addition, as shown in FIG. 1C and FIG. 1D, as the first signal circuit 142 is surrounded by the first annular retaining wall 170 and a ground path L3 defined by the first inner circuit layer 115 in an enclosed manner, and the second signal circuit 152 is surrounded by the second annular retaining wall 180 and the ground path L4 defined by the second inner circuit layer 117 in an enclosed manner, a high-frequency, high-speed loop is well formed.

In the manufacturing process, if the third dielectric layer 120 and the fourth dielectric layer 130 are, for example, photoimageable dielectric (PID) materials, the dry-film lamination may be first performed on the two opposite sides of the substrate 110, and the photolithography process is then performed to form closed trenches with a width of, for example, 100 μm and a diameter of, for example, 600 μm respectively on the third dielectric layer 120 and the fourth dielectric layer 130. Alternatively, if the third dielectric layer 120 and the fourth dielectric layer 130 are, for example, pre-pregs or Ajinomoto Build-up Films (ABF), laser ablation may be performed to form closed trenches with a width of, for example, 100 μm and a diameter of, for example, 600 μm respectively on the third dielectric layer 120 and the fourth dielectric layer 130. Next, a conductive metal paste (such as conductive copper paste) is coated on the trench by transient liquid phase sintering (TLPS) and air-dried to achieve the effect of electrical and thermal conductivity, and it is suitable for bonding with any metal material, and the material does not change back to liquid state due to heat. The first annular retaining wall 170 and the second annular retaining wall 180 are so far completed.

Note that the first annular retaining wall 170 and the second annular retaining wall 180 in this embodiment are formed by disposing conductive pastes in the third dielectric layer 120 and the fourth dielectric layer 130, such that the first annular retaining wall 170 and the second annular retaining wall 180 are respectively a solid retaining wall structure, but the disclosure is not limited thereto. The conductive material of the annular retaining wall may also be a metal plating layer or an electroless metal plating layer. In another embodiment not illustrated, the first annular retaining wall and the second annular retaining wall may also be formed by using a metal plating layer, an electroless metal plating layer, or a metal conductive paste in the third dielectric layer and the fourth dielectric layer, such that the first annular retaining wall and the second annular retaining wall are e respectively a groove-shaped retaining wall structure, which is still within the scope of the disclosure.

In short, in this embodiment, the signal path L1 defined by the first signal circuit 142, the conductive through hole 160, and the second signal circuit 152 is surround and enclosed by the ground path L2 defined by the first ground circuit 144, the first annular retaining wall 170, the first inner circuit layer 115, the conductive connection layer 119, the second inner circuit layer 117, the second annular retaining wall 180, and the second ground circuit 154. In other words, as the well-closed ground path L2 is disposed around the signal path L1 that can transmit high-frequency and high-speed signals such as 5G, a high-frequency, high-speed loop is thus well formed, such that the circuit board structure 100 of this embodiment is able to provide better signal integrity. Here, the high frequency means that the frequency is greater than 1 GHz; and the high speed means that the data transmission speed is greater than 100 Mbps. Furthermore, since the first annular retaining wall 170 and the second annular retaining wall 180 are closed boundary structures, the signals of the conductive through hole 160 is covered completely. Compared with the prior art where single-row blind vias with gaps are disposed around conductive through holes, the circuit board structure 100 of this embodiment is able to prevent energy loss and reduce noise interference effectively to provide better signal integrity. In addition, the conductive through hole 160, the conductive connection layer 119, and the second dielectric layer 113 define a coaxial via, and the second dielectric layer 113 is located between the conductive through hole 160 and the conductive connection layer 119. Compared with the prior build-up approach of pressing insulating layers to insulate the inner conductor layer and the outer conductor layer of the coaxial via, the manufacturing process of the circuit board structure 100 of this embodiment is able to prevent impedance mismatch that affects the integrity of the high-frequency signal.

Figure 2A:
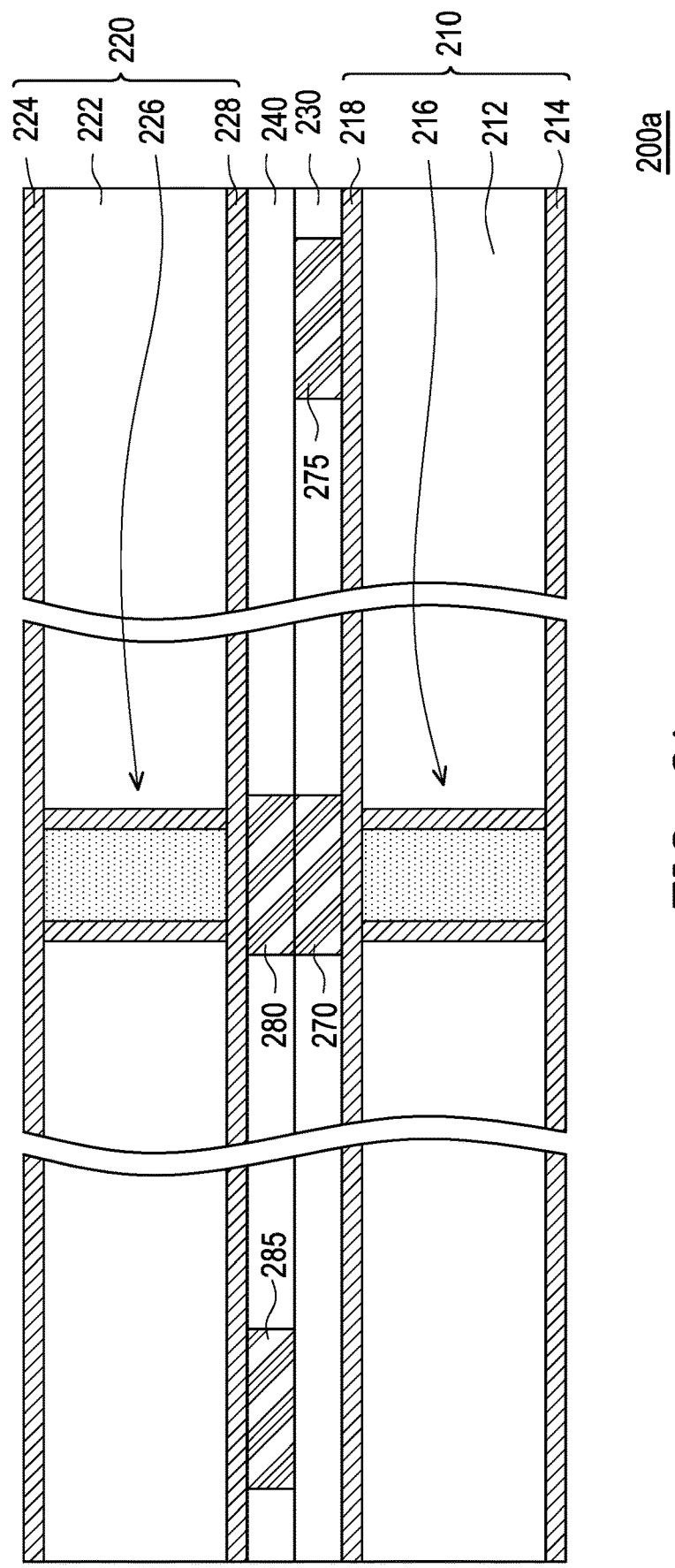
FIG. 2A is a schematic cross-sectional view of a circuit board structure according to another embodiment of the disclosure.
Figure 2B:
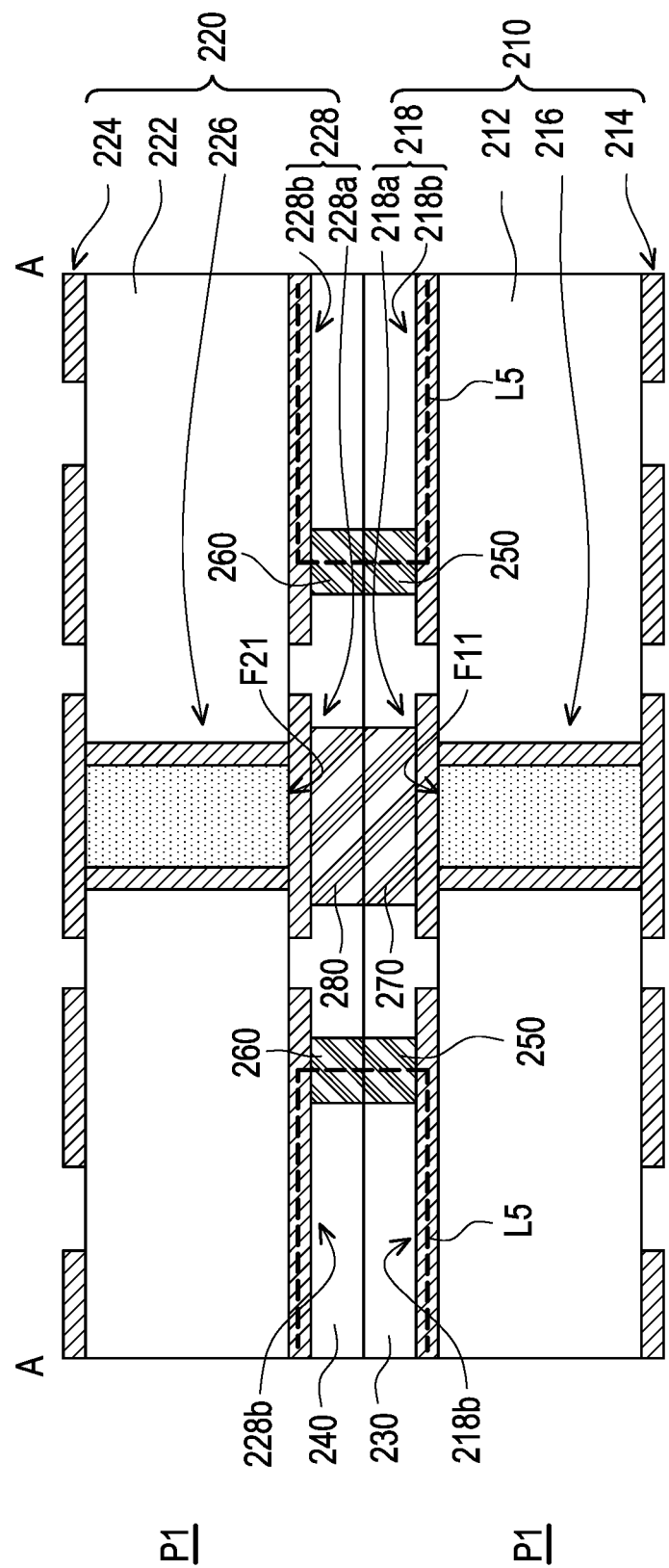
FIG. 2B is another partial cross-sectional schematic diagram of the circuit board structure in FIG. 2A.
Figure 2C:
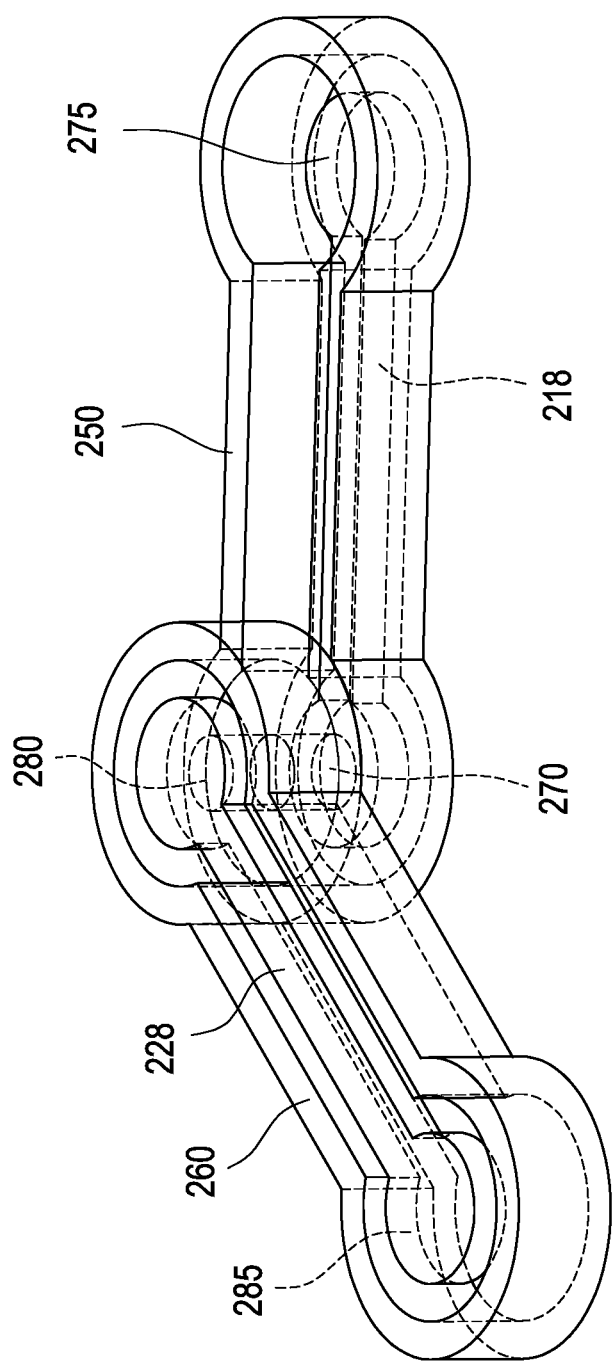
FIG. 2C is a partial perspective view of the circuit board structure in FIG. 2A.
Figure 2D:
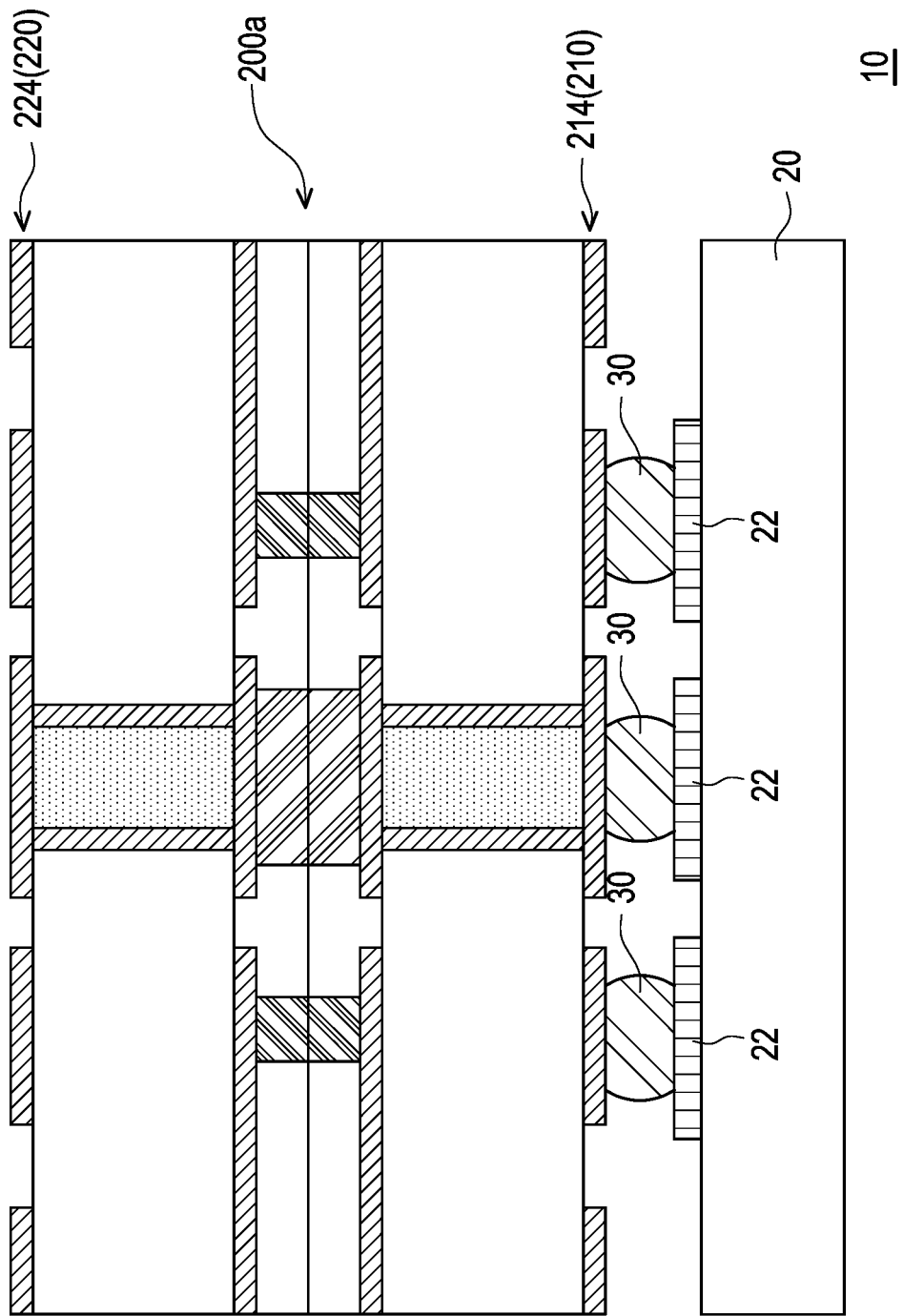
FIG. 2D is a schematic partial cross-sectional view of an electronic device including the circuit board structure in FIG. 2A.
Figure 3A:
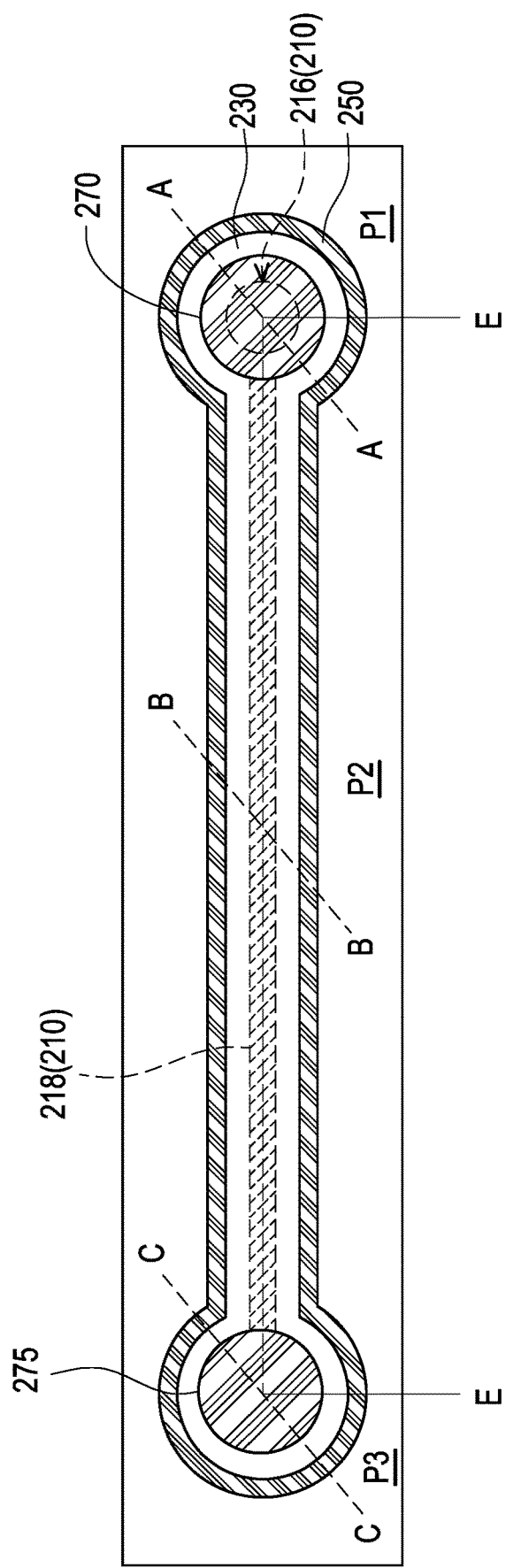
FIG. 3A is a schematic top view of the first substrate, the third dielectric layer, and the first annular retaining wall of the circuit board structure in FIG. 2A.
Figure 3B:
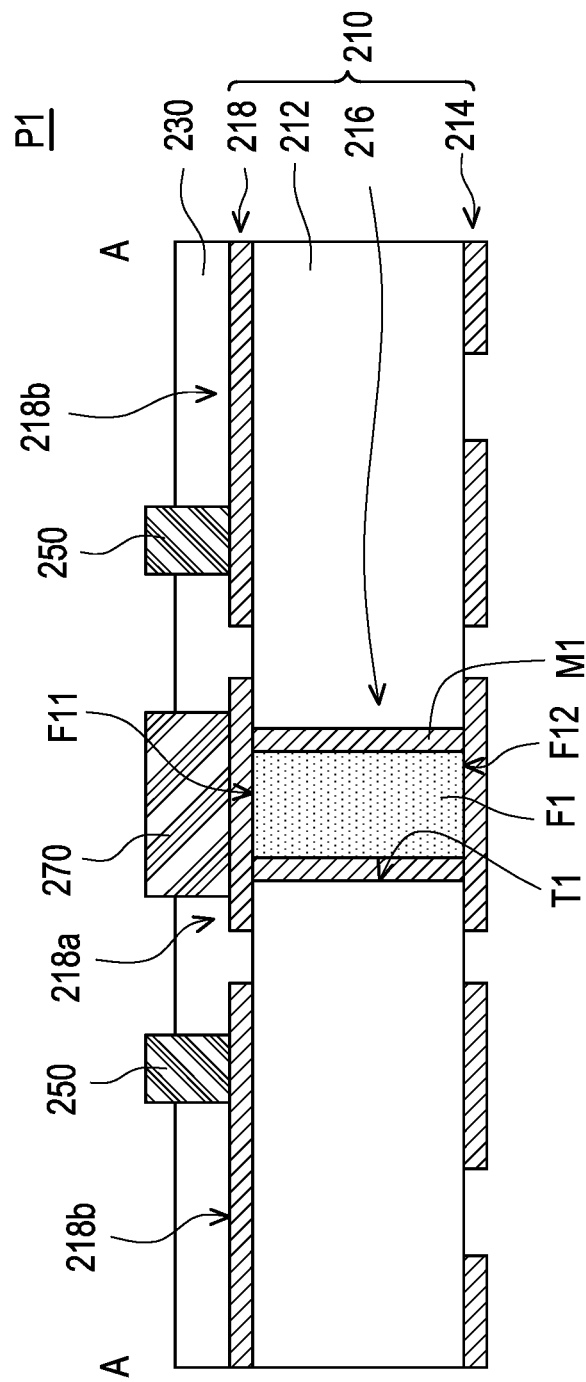
FIG. 3B is a schematic cross-sectional view along line A-A in FIG. 3A.
Figure 3C:
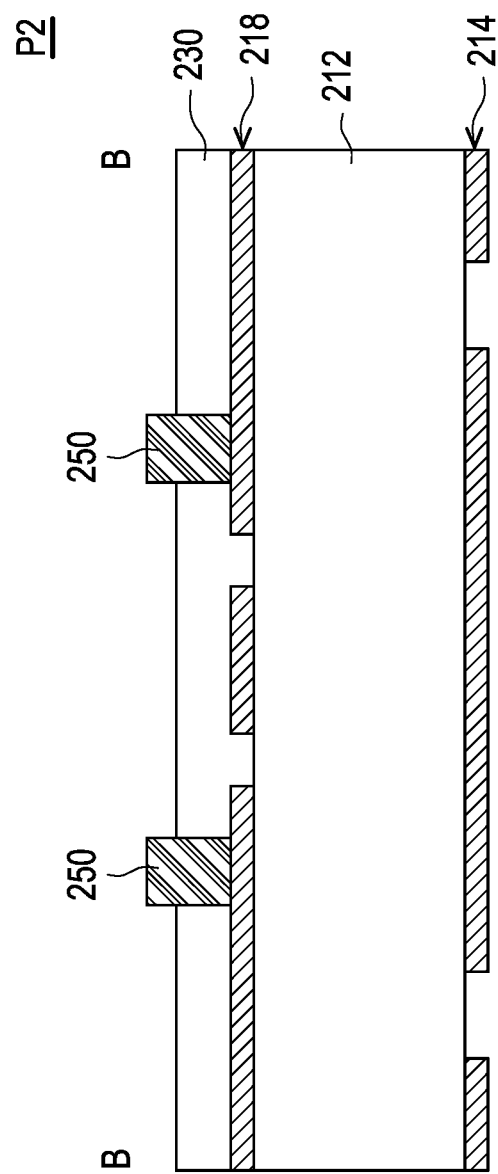
FIG. 3C is a schematic cross-sectional view along line B-B in FIG. 3A.
Figure 3D:
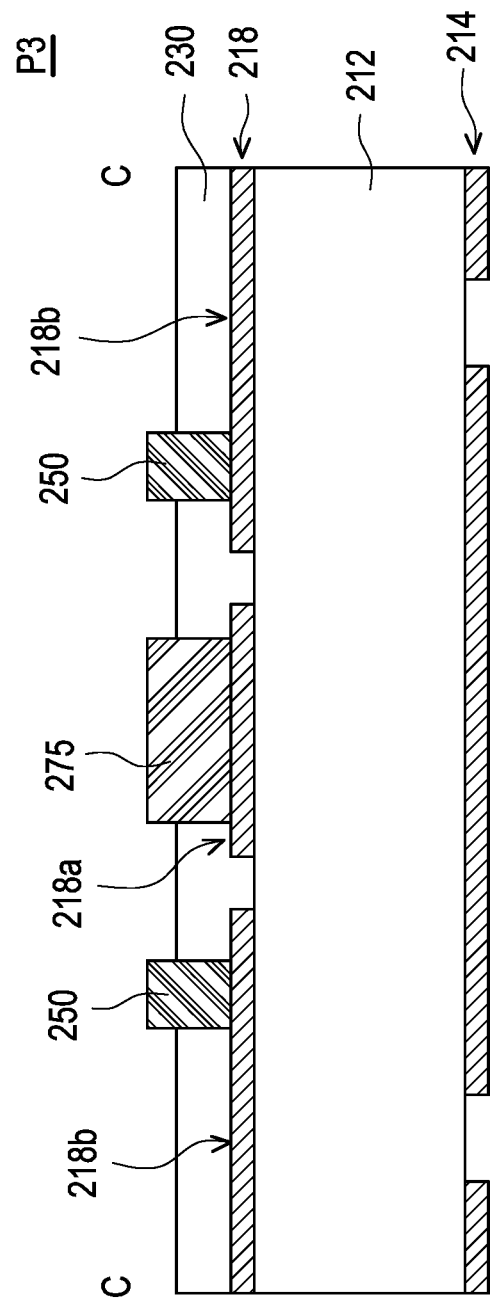
FIG. 3D is a schematic cross-sectional view along line C-C in FIG. 3A.
Figure 4A:
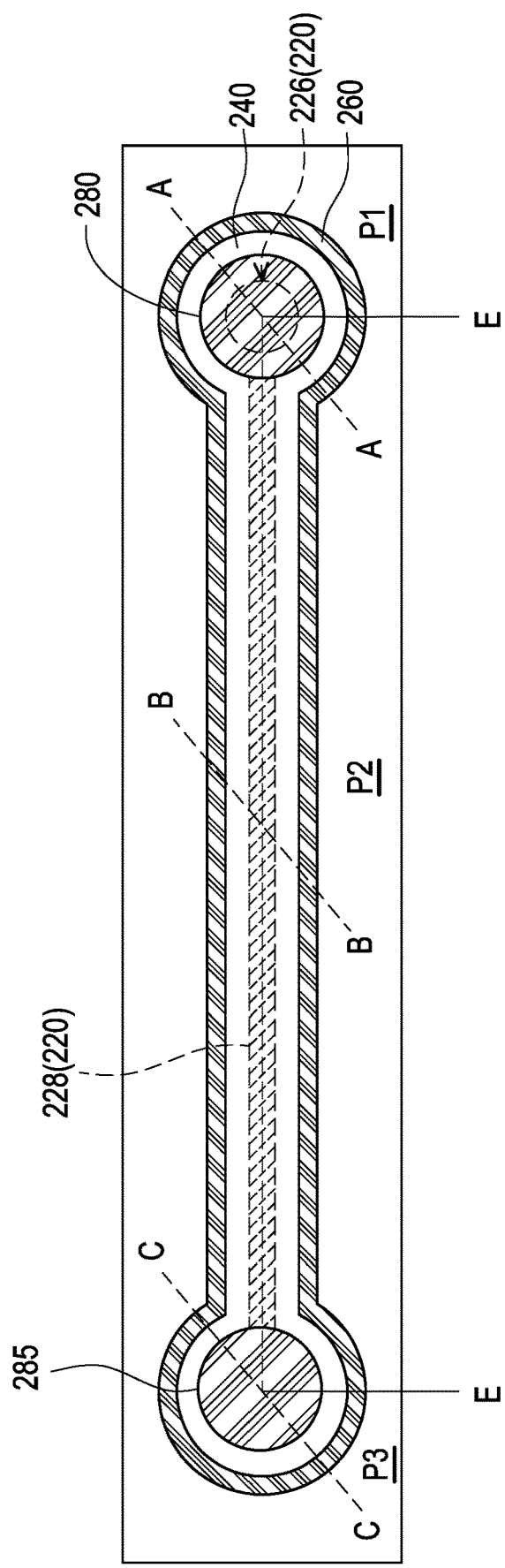
FIG. 4A is a schematic top view illustrating the second substrate, the fourth dielectric layer, and the second annular retaining wall of the circuit board structure in FIG. 2A.
Figure 4B:
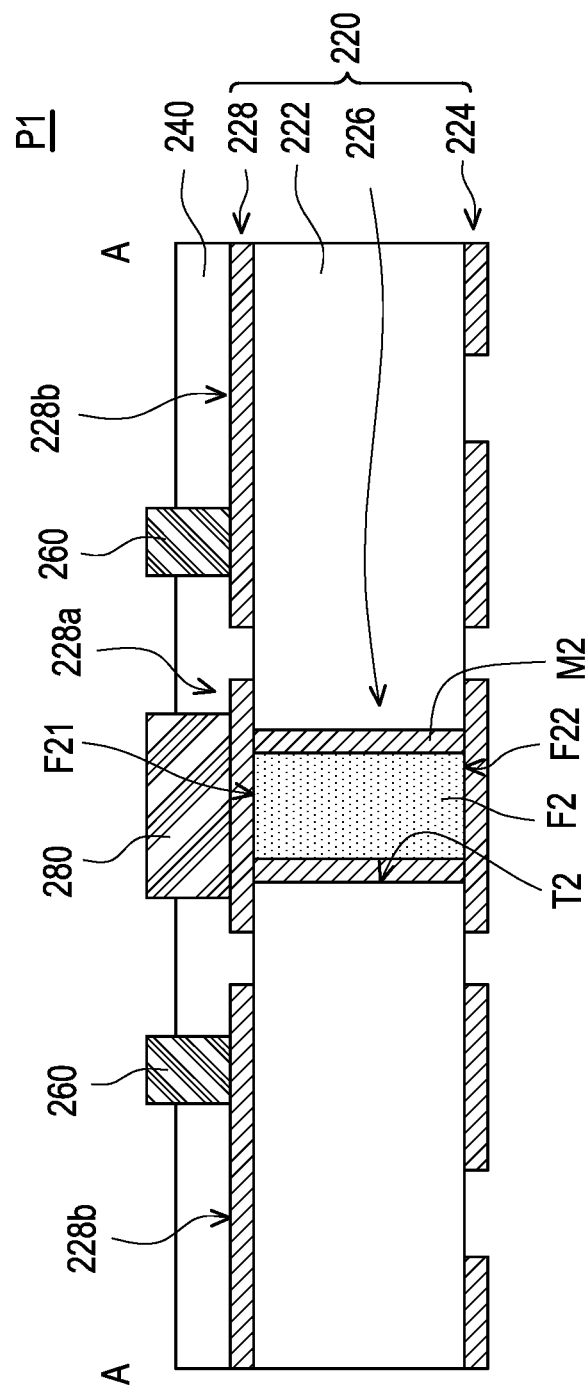
FIG. 4B is a schematic cross-sectional view along line A-A in FIG. 4A.
Figure 4C:
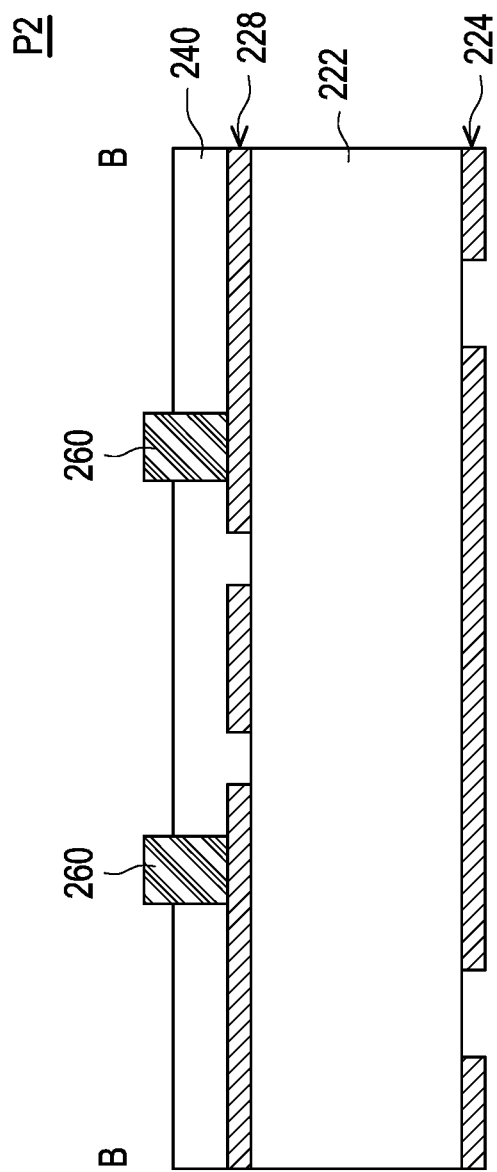
FIG. 4C is a schematic cross-sectional view along line B-B in FIG. 4A.
Figure 4D:
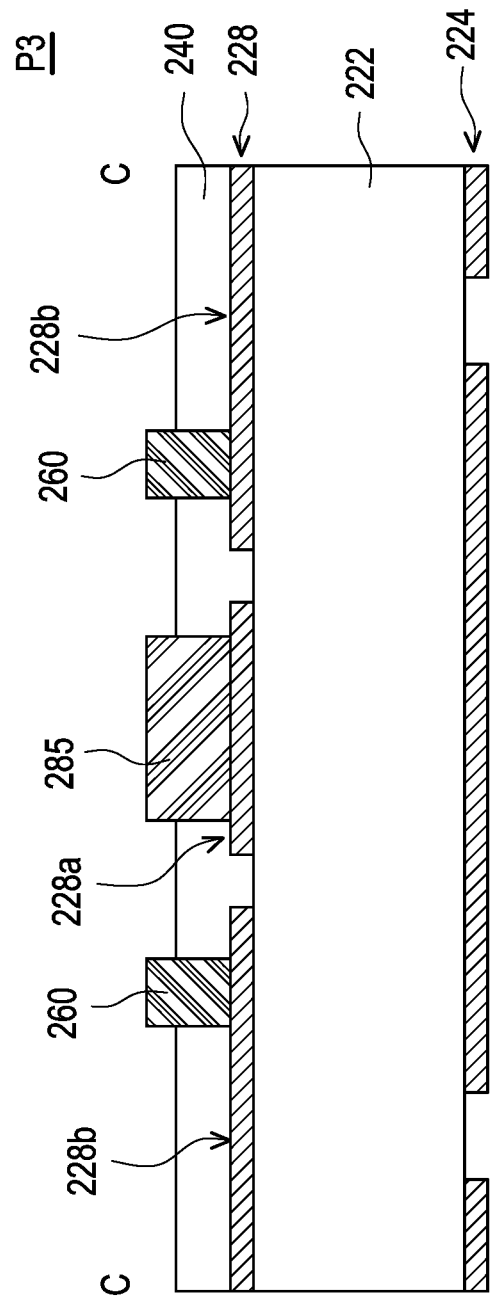
FIG. 4D is a schematic cross-sectional view along line C-C in FIG. 4A.

FIG. 2A is a schematic cross-sectional view of a circuit board structure according to another embodiment of the disclosure. FIG. 2B is another partial cross-sectional schematic diagram of the circuit board structure in FIG. 2A. FIG. 2C is a partial perspective view of the circuit board structure in FIG. 2A. FIG. 2D is a schematic partial cross-sectional view of an electronic device including the circuit board structure in FIG. 2A. FIG. 3A is a schematic top view of the first substrate, the third dielectric layer, and the first annular retaining wall of the circuit board structure in FIG. 2A. FIG. 3B is a schematic cross-sectional view along line A-A in FIG. 3A, that is, a schematic cross-sectional view at position P1. FIG. 3C is a schematic cross-sectional view along line B-B in FIG. 3A, that is, a schematic cross-sectional view at position P2. FIG. 3D is a schematic cross-sectional view along line C-C in FIG. 3A, that is, a schematic cross-sectional view at a position P3. FIG. 4A is a schematic top view illustrating the second substrate, the fourth dielectric layer, and the second annular retaining wall of the circuit board structure in FIG. 2A. FIG. 4B is a schematic cross-sectional view along line A-A in FIG. 4A, that is, a schematic cross-sectional view at position P1. FIG. 4C is a schematic cross-sectional view along line B-B in FIG. 4A, that is, a schematic cross-sectional view at position P2. FIG. 4D is a schematic cross-sectional view along line C-C in FIG. 4A, that is, a schematic cross-sectional view at position P3. Note that FIG. 2A is a schematic cross-sectional view along line E-E in FIG. 3A and FIG. 4A, and FIG. 2B is a cross-sectional schematic diagram showing the first substrate 210 at position P1 butted to the second substrate 220 at position P1.

First, please refer to FIG. 2A, FIG. 2C, FIG. 3A, and FIG. 4A. In this embodiment, the circuit board structure 200 includes a first substrate 210, a second substrate 220, a third dielectric layer 230, a fourth dielectric layer 240, a first annular retaining wall 250, and a second annular retaining wall 260.

As shown in FIG. 2A, FIG. 3A, FIG. 3B, FIG. 3C, and FIG. 3D, the first substrate 210 in this embodiment includes a first dielectric layer 212, a first external circuit layer 214, a first conductive through hole 216, and a first inner circuit layer 218. The first external circuit layer 214 and the first inner circuit layer 218 are respectively located on opposite sides of the first dielectric layer 212. The first conductive through hole 216 penetrates through the first dielectric layer 212 and connects the first external circuit layer 214 and the first inner circuit layer 218 electrically. Here, as shown in FIG. 3B, the first conductive through hole 216 in this embodiment includes a first via T1, a first conductive material layer M1, and a first hole-filling material F1. The first via T1 penetrates through the first dielectric layer 212, and the first conductive material layer M1 covers the inner wall of the first via T1 and connects the first external circuit layer 214 and the first inner circuit layer 218 electrically. The first hole-filling material F1 fills the first via T1, and the first inner circuit layer 218 and the first external circuit layer 214 respectively cover a first upper surface F11 and an opposing first lower surface F12 of the first hole-filling material F1. The third dielectric layer 230 covers the first inner circuit layer 218 of the first substrate 210. The first annular retaining wall 250 is buried in the third dielectric layer 230 and is electrically connected to the first internal circuit layer 218. The orthographic projection of the first annular retaining wall 250 on the first substrate 210 surrounds the first conductive contact hole 216.

Please further refer to FIG. 3A, FIG. 3B, and FIG. 3D at the same time. The circuit board structure 200a of this embodiment further includes a first joint portion 270 and a second joint portion 275. The first joint portion 270 and the second joint portion 275 are disposed on the first inner circuit layer 218, and the first annular retaining wall 250 surrounds the first joint portion 270 and the second joint portion 275. The first joint portion 270 corresponds to the first conductive through hole 216. Furthermore, the first inner circuit layer 218 of this embodiment includes a first signal circuit 218a and a first ground circuit 218b. The first annular retaining wall 250 is disposed on the first ground circuit 218b, and the first joint portion 270 and the second joint portion 275 are disposed on the first signal circuit 218a.

In the manufacturing process, the first joint portion 270 and the second joint portion 275 are formed simultaneously with the first annular retaining wall 250. Specifically, if the third dielectric layer 230 is, for example, a photoimageable dielectric (PID) material, the dry-film lamination may be first performed on the two opposite sides of the first substrate 210, and the photolithography process is then performed to form closed trenches and openings on the third dielectric layer 230. Alternatively, if the third dielectric layer 230 is, for example, a pre-preg or an Ajinomoto Build-up Film (ABF), laser ablation may be performed to form closed trenches and openings on the third dielectric layer 230. Next, a conductive metal paste (such as conductive copper paste) is coated on the closed trenches and the openings by transient liquid phase sintering (TLPS) and air-dried to achieve the effect of electrical and thermal conductivity, and it is suitable for bonding with any metal material, and the material does not change back to liquid state due to heat. The first annular retaining wall 250 formed in the closed trenches and the first joint portion 270 and the second joint portion 275 formed in the openings are so far completed. Here, the width of the first joint portion 270 and the width of the second joint portion 275 are respectively larger than the width of the first annular retaining wall 250.

Next, please refer to FIG. 2A, FIG. 4A, FIG. 4B, FIG. 4C and FIG. 4D. In this embodiment, the second substrate 220 includes a second dielectric layer 222, a second external circuit layer 224, a second conductive through hole 226, and a second inner circuit layer 228. The second external circuit layer 224 and the second inner circuit layer 228 are respectively located on two opposite sides of the second dielectric layer 222. The second conductive through hole 226 penetrates through the second dielectric layer 222 and connects the second external circuit layer 224 and the second inner circuit layer 228 electrically. As shown in FIG. 4B, the second conductive through hole 226 in this embodiment includes a second via T2, a second conductive material layer M2, and a second hole-filling material F2. The second via T2 penetrates through the second dielectric layer 222. The second conductive material layer M2 covers the inner wall of the second via T2 and connects the second external circuit layer 224 and the second inner circuit layer 228 electrically. The second hole-filling material F2 fills the second via T2, and the second inner circuit layer 228 and the second external circuit layer 224 respectively cover a second upper surface F21 and an opposing second lower surface F22 of the second hole-filling material F2. The fourth dielectric layer 240 covers the second inner circuit layer 228 of the second substrate 220. The second annular retaining wall 260 is buried in the fourth dielectric layer 240 and is electrically connected to the second inner circuit layer 228, and the orthographic projection of the second annular retaining wall 260 on the second substrate 220 surrounds the second conductive through hole 226.

Please refer to FIG. 4A, FIG. 4B and FIG. 4D at the same time. The circuit board structure 200a of this embodiment further includes a third joint portion 280 and a fourth joint portion 285. The third joint portion 280 and the fourth joint portion 285 are disposed on the second inner circuit layer 228, and the second annular retaining wall 260 surrounds the third joint portion 280 and the fourth joint portion 285. The third joint portion 280 corresponds to the second conductive through hole 226. Furthermore, the second inner circuit layer 228 of this embodiment includes a second signal circuit 228a and a second ground circuit 228b. The second annular retaining wall 260 is disposed on the second ground circuit 228b, and the third joint portion 280 and the fourth joint portion 285 are disposed on the second signal circuit 228a.

In the manufacturing process, the third joint portion 280 and the fourth joint portion 285 are formed simultaneously with the second annular retaining wall 260. Specifically, if the fourth dielectric layer 240 is, for example, a photoimageable dielectric (PID) material, the dry-film lamination may be first performed on the two opposite sides of the second substrate 220, and the photolithography process is then performed to form closed trenches and openings on the fourth dielectric layer 240. Alternatively, if the fourth dielectric layer 240 is, for example, a pre-preg or an Ajinomoto Build-up Film (ABF), laser ablation may be performed to form closed trenches and openings on the fourth dielectric layer 240. Next, a conductive metal paste (such as conductive copper paste) is coated on the closed trenches and the openings by transient liquid phase sintering (TLPS) and air-dried to achieve the effect of electrical and thermal conductivity, and it is suitable for bonding with any metal material, and the material does not change back to liquid state due to heat. The second annular retaining wall 260 formed in the closed trenches and the third joint 280 and the fourth joint 285 formed in the openings are so far completed. Here, the width of the third joint portion 280 and the width of the fourth joint portion 285 are respectively larger than the width of the second annular retaining wall 260.

Next, please refer to FIG. 2A, FIG. 2B and FIG. 2C at the same time. The third dielectric layer 230 is connected to the fourth dielectric layer 240, and part of the first annular retaining wall 250 is connected to part of the second annular retaining wall 260, such that the first substrate 210 is butted to the second substrate 220. At this time, the first joint portion 270 is bonded to the third joint portion 280, and the first conductive through hole 216 overlaps the second conductive through hole 226, the first joint portion 270, and the third joint portion 280. The second ground circuit 228*b*, the second annular retaining wall 260, the first annular retaining wall 250, and the first ground circuit 218*b* define a ground path L5. The ground path L5 surrounds the first joint portion 270 and the third joint portion 280. In other words, in this embodiment, as high-frequency, high-speed signals are disposed in the inner layer (i.e., the first signal circuit 218*a* and the second signal circuit 228*a*) and a well-closed ground path L5 is disposed around them, a high-frequency, high-speed loop is well formed, such that the circuit board structure 200*a* of this embodiment is able to provide better signal integrity.

In addition, in FIG. 2D, the electronic device 10 in this embodiment includes a circuit board structure 200*a* (such as the circuit board structure 200*a* in FIG. 2B) and an electronic component 20. The electronic component 20 is electrically connected to the circuit board structure 200*a*, and the electronic component 20 includes a plurality of pads 22. The electronic device 10 of this embodiment further includes a plurality of connecting members 30 disposed between the first external circuit layer 214 of the first substrate 210 of the circuit board structure 200*a* and the pads 22 of the electronic component 20. The electronic component 20 is electrically connected to the circuit board structure 200*a* through the connecting member 30. Here, the connecting member 30 is, for example, a solder ball, but the disclosure is not limited thereto. In terms of application, an antenna structure may be disposed on the other side of the circuit board structure 200*a* relative to the electronic component 20, and the antenna structure may be electrically connected to the first external circuit layer 224 of the second substrate 220 of the circuit board structure 200*a*. In the application of integrated circuits and antennas, the circuit board structure 200*a* of this embodiment is able to solve the problem of signal interference on the same plane, reducing signal energy loss and noise interference, thereby improving signal transmission reliability.

Figure 5A:
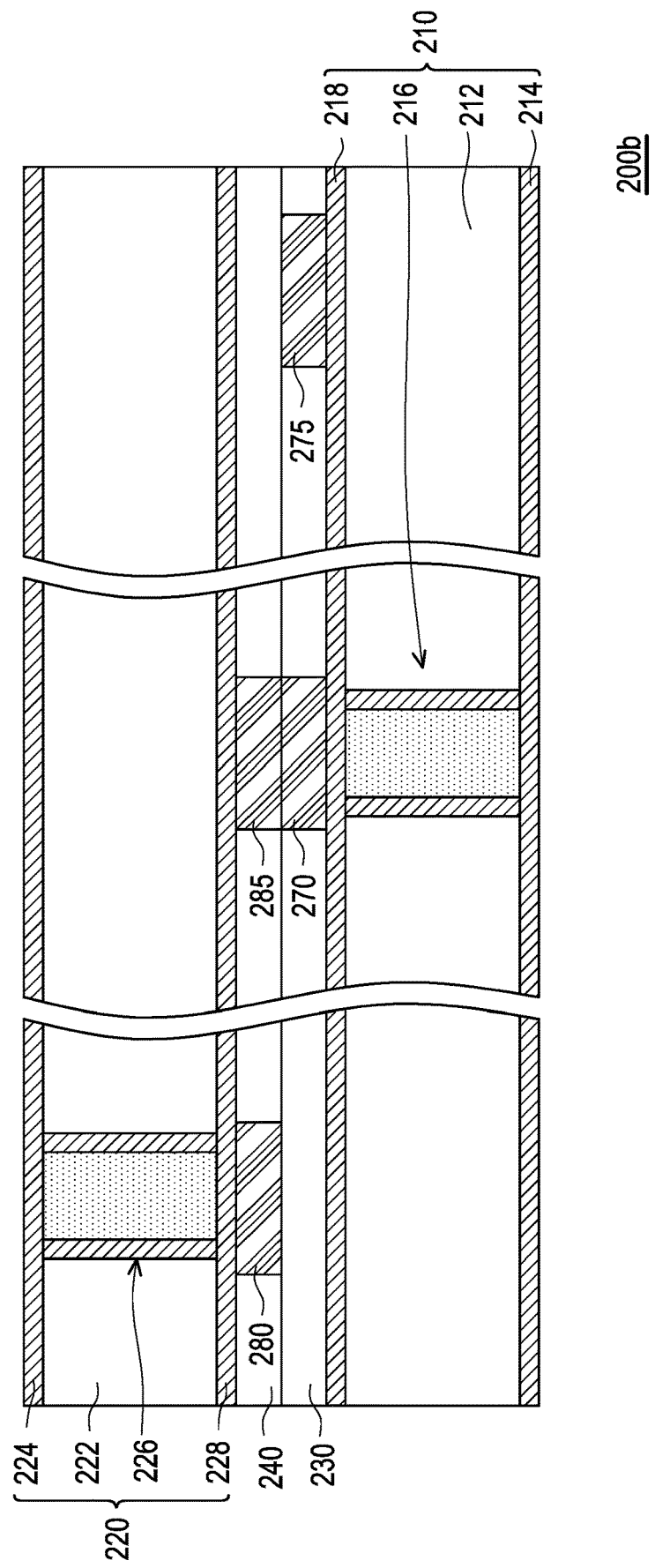
FIG. 5A is a schematic cross-sectional view of a circuit board structure according to another embodiment of the disclosure.
Figure 5B:
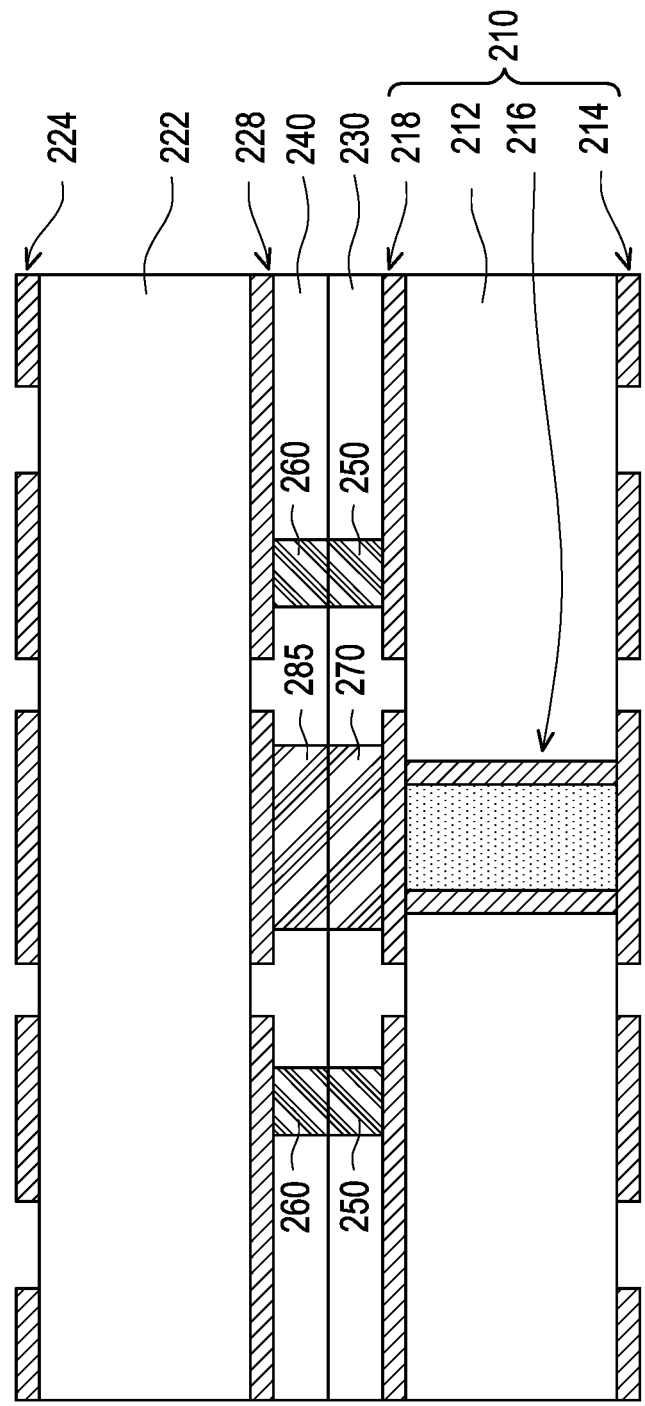
FIG. 5B is another partial cross-sectional schematic diagram of the circuit board structure in FIG. 5A.

FIG. 5A is a schematic cross-sectional view of a circuit board structure according to another embodiment of the disclosure. FIG. 5B is another partial cross-sectional schematic diagram of the circuit board structure in FIG. 5A. Please refer to FIG. 2A, FIG. 2B, FIG. 5A and FIG. 5B at the same time. The circuit board structure 200*b* of this embodiment is similar to the circuit board structure 200*a* described above. The difference between the two is that, in this embodiment, the first substrate 210 at position P1 is butted to the second substrate 220 at position P3. When the first substrate 210 is butted to the second substrate 220, the first joint portion 270 is jointed to the fourth joint portion 285, and part of the first annular retaining wall 250 is jointed to part of the second annular retaining wall 260. At this time, the first conductive through hole 216 does not overlap the second conductive through hole 226, and the first conductive through hole 216 overlaps the first joint portion 270 and the fourth joint portion 285, forming a fan-out circuit board structure 200*b* that is conducive for subsequent diverse applications.

Figure 6A:
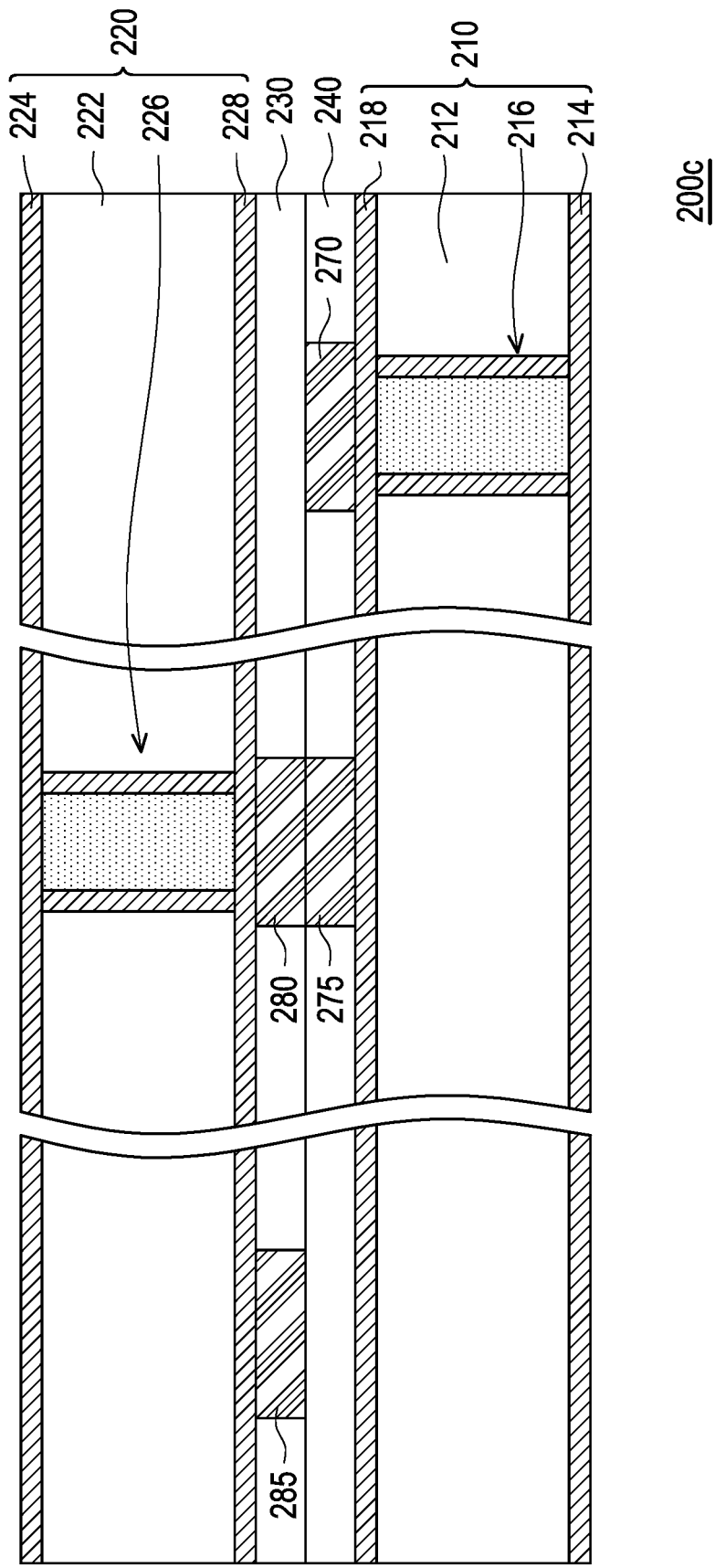
FIG. 6A is a schematic cross-sectional view of a circuit board structure according to another embodiment of the disclosure.
Figure 6B:
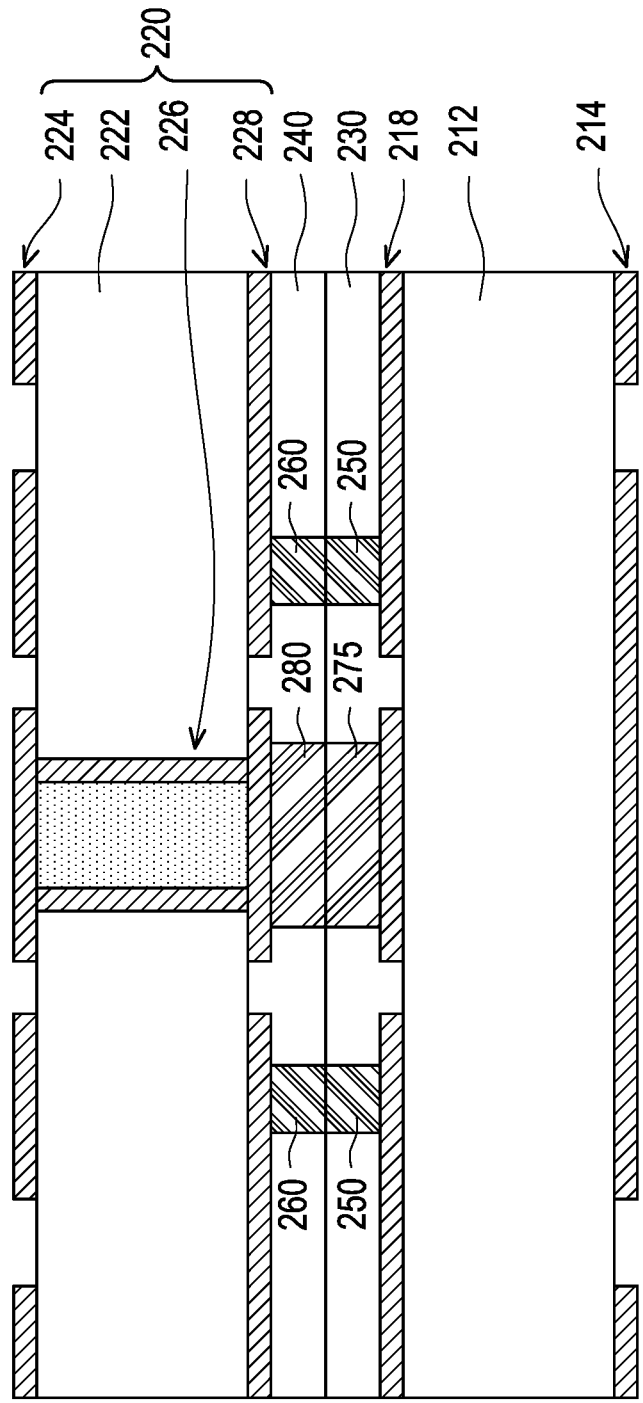
FIG. 6B is another partial cross-sectional schematic diagram of the circuit board structure in FIG. 6A.

FIG. 6A is a schematic cross-sectional view of a circuit board structure according to another embodiment of the disclosure. FIG. 6B is another partial cross-sectional schematic diagram of the circuit board structure in FIG. 6A. Please refer to FIG. 2A, FIG. 2B, FIG. 6A, and FIG. 6B at the same time. The circuit board structure 200*c* of this embodiment is similar to the circuit board structure 200*a* described above. The difference between the two is that, in this embodiment, the first substrate 210 at position P3 is butted to the second substrate 220 at position P1. When the first substrate 210 is butted to the second substrate 220, the second joint portion 275 is jointed to the third joint portion 280, and part of the first annular retaining wall 250 is jointed to part of the second annular retaining wall 260. At this time, the first conductive through hole 216 does not overlap the second conductive through hole 226, and the second conductive through hole 226 overlaps the third joint portion 280 and the second joint portion 275, forming a fan-out circuit board structure 200*c* that is conducive for subsequent diverse applications.

Figure 7A:
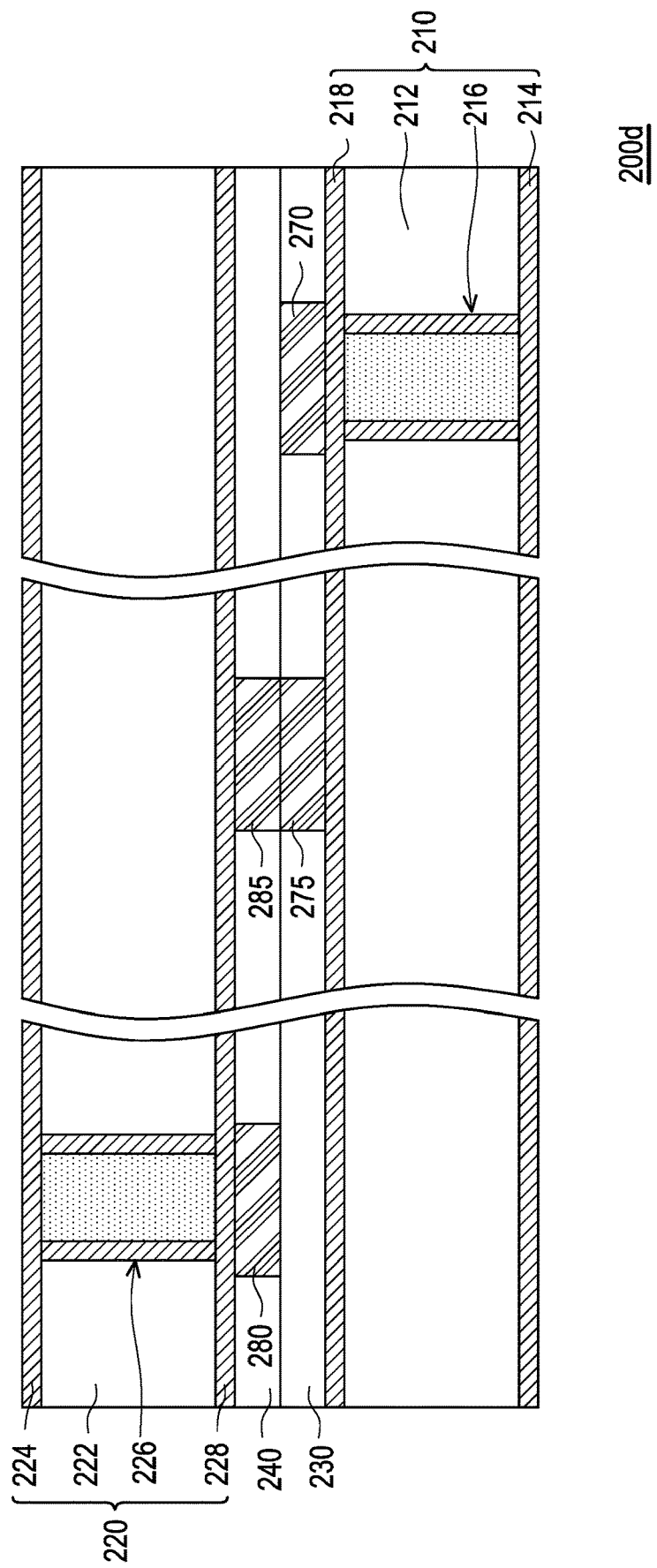
FIG. 7A is a schematic cross-sectional view of a circuit board structure according to another embodiment of the disclosure.
Figure 7B:
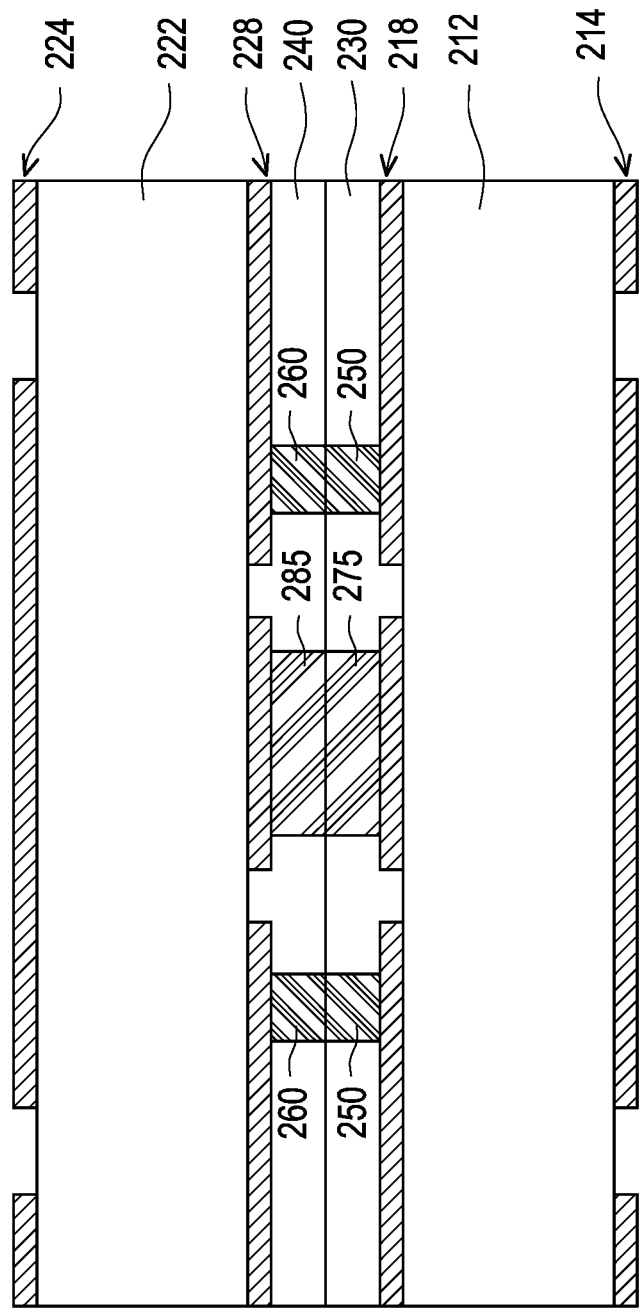
FIG. 7B is another partial cross-sectional schematic diagram of the circuit board structure in FIG. 7A.

FIG. 7A is a schematic cross-sectional view of a circuit board structure according to another embodiment of the disclosure. FIG. 7B is another partial cross-sectional schematic diagram of the circuit board structure in FIG. 7A. Please refer to FIG. 2A, FIG. 2B, FIG. 7A, and FIG. 7B at the same time. The circuit board structure 200*d* of this embodiment is similar to the circuit board structure 200*a* described above. The difference between the two is that, in this embodiment, the first substrate 210 at position P3 is butted to the second substrate 220 at position P3. When the first substrate 210 is butted to the second substrate 220, the second joint portion 275 is joined to the fourth joint portion 285, and part of the first annular retaining wall 250 is joined to part of the second annular retaining wall 260. At this time, the first conductive through hole 216 does not overlap the second conductive through hole 226, the second joint portion 275, and the fourth joint portion 285, forming a fan-out circuit board structure 200*d* that is conducive for subsequent diverse applications.

To sum up, in the design of the circuit board structures of the disclosure, the annular retaining wall surrounds the conductive through hole, and the annular retaining wall as a closed boundary structure is able to reduce the electromagnetic interference (EMI) and cover the signal of the conductive through hole completely. Compared with the prior art with single-row blind vias with gaps around the conductive through hole, the circuit board structures of the disclosure is able to prevent energy loss and reduce noise interference effectively to provide better signal integrity.

Although the disclosure has been disclosed as above with examples, they are not intended to limit the disclosure. Anyone with ordinary knowledge in the art can make changes and modifications without departing from the spirit and scope of the disclosure. The protection scope of the disclosure shall be determined by the scope of the claims attached.

What is claimed is:
1. A circuit board structure, comprising:
a substrate having an opening and comprising a first dielectric layer, a second dielectric layer, a first inner circuit layer, a second inner circuit layer, and a conductive connection layer, wherein the opening penetrates through the first dielectric layer, the first dielectric layer has a first surface and a second surface opposite to each other, the first inner circuit layer is disposed on the first surface, and the second inner circuit layer is disposed on the second surface, the conductive connection layer covers an inner wall of the opening and connects the first inner circuit layer and the second inner circuit layer, the second dielectric layer fills the opening, and the second dielectric layer has a third surface and a fourth surface opposite to each other;

a third dielectric layer covering the first inner circuit layer and the third surface;
a fourth dielectric layer covering the second inner circuit layer and the fourth surface;
a first external circuit layer disposed on the third dielectric layer;
a second external circuit layer disposed on the fourth dielectric layer;
a conductive through hole penetrating through the third dielectric layer, the second dielectric layer, and the fourth dielectric layer, and connecting the first external circuit layer and the second external circuit layer electrically;
a first annular retaining wall disposed in the third dielectric layer, surrounding the conductive through hole, and connecting the first external circuit layer and the first inner circuit layer electrically; and
a second annular retaining wall disposed in the fourth dielectric layer, surrounds the conductive through hole, and connecting the second external circuit layer and the second inner circuit layer electrically.

2. The circuit board structure according to claim 1, wherein the first external circuit layer, the conductive through hole, and the second external circuit layer define a signal path, the first external circuit layer, the first annular retaining wall, the first inner circuit layer, the conductive connection layer, the second inner circuit layer, the second annular retaining wall, and the second external circuit layer define a ground path, and the ground path surrounds the signal path.

3. The circuit board structure according to claim 2, wherein
the first external circuit layer comprises a first signal circuit and a first ground circuit, and the second external circuit layer comprises a second signal circuit and a second ground circuit,
the first signal circuit, the conductive through hole, and the second signal circuit define the signal path, and
the first ground circuit, the first annular retaining wall, the first inner circuit layer, the conductive connection layer, the second inner circuit layer, the second annular retaining wall, and the second ground circuit define the ground path.

4. The circuit board structure according to claim 1, wherein
the conductive through hole comprises a via, a conductive material layer, and a hole-filling material,
the via penetrates through the third dielectric layer, the second dielectric layer, and the fourth dielectric layer, and the conductive material layer covers an inner wall of the via and connects the first external circuit layer and the second external circuit layer electrically, and
the hole-filling material fills the via, and the first external circuit layer and the second external circuit layer respectively cover an upper surface and an opposing lower surface of the hole-filling material.

5. A circuit board structure, comprising:
a first substrate comprising a first dielectric layer, a first external circuit layer, a first conductive through hole, and a first inner circuit layer, wherein the first external circuit layer and the first inner circuit layer are respectively located on opposite sides of the first dielectric layer, and the first conductive through hole penetrates through the first dielectric layer and connects the first external circuit layer and the first internal circuit layer electrically;
a second substrate comprising a second dielectric layer, a second external circuit layer, a second conductive through hole, and a second inner circuit layer, wherein the second external circuit layer and the second inner circuit layer are respectively located on opposite sides of the second dielectric layer, and the second conductive through hole penetrates through the second dielectric layer and connects the second external circuit layer and the second inner circuit layer electrically;
a third dielectric layer covering the first inner circuit layer;
a fourth dielectric layer covering the second inner circuit layer;
a first annular retaining wall disposed in the third dielectric layer and electrically connected to the first internal circuit layer, wherein an orthographic projection of the first annular retaining wall on the first substrate surrounds the first conductive through hole; and
a second annular retaining wall disposed in the fourth dielectric layer and electrically connected to the second inner circuit layer, wherein an orthographic projection of the second annular retaining wall on the second substrate surrounds the second conductive through hole, the third dielectric layer is connected to the fourth dielectric layer, and part of the first annular retaining wall is connected to part of the second annular retaining wall, such that the first substrate is butted to the second substrate.

6. The circuit board structure according to claim 5, further comprising:
a first joint portion and a second joint portion disposed on the first inner circuit layer, wherein the first annular retaining wall surrounds the first joint portion and the second joint portion, and the first joint portion corresponds to the first conductive through hole; and
a third joint portion and a fourth joint portion disposed on the second inner circuit layer, wherein the second annular retaining wall surrounds the third joint portion and the fourth joint portion, and the third joint portion corresponds to the second conductive through hole;
wherein the first inner circuit layer comprises a first signal circuit and a first ground circuit, the first annular retaining wall is disposed on the first ground circuit, and the first joint portion and the second joint portion are disposed on the first signal circuit, the second inner circuit layer comprises a second signal circuit and a second ground circuit, the second annular retaining wall is disposed on the second ground circuit, and the third joint portion and the fourth joint portion are disposed on the second signal circuit.

7. The circuit board structure according to claim 6, wherein when the first substrate is butted to the second substrate, the first joint portion is jointed to the third joint portion, part of the first annular retaining wall is joined to part of the second annular retaining wall, the first conductive through hole overlaps the second conductive through hole, the first joint portion, and the third joint portion, and the first ground circuit, the first annular retaining wall, the second annular retaining wall, and the second ground circuit define a ground path, and the ground path surrounds the first joint portion and the third joint portion.

8. The circuit board structure according to claim 6, wherein when the first substrate is butted to the second substrate, the first joint portion is jointed to the fourth joint portion, part of the first annular retaining wall is joined to part of the second annular retaining wall, the first conductive through hole does not overlap the second conductive through hole, and the first conductive through hole overlaps the first joint portion and the fourth joint portion.

9. The circuit board structure according to claim 6, wherein when the first substrate is butted to the second substrate, the second joint portion is jointed to the third joint portion, part of the first annular retaining wall is joined to part of the second annular retaining wall, the first conductive through hole does not overlap the second conductive through hole, and the second conductive through hole overlaps the third joint portion and the second joint portion.

10. The circuit board structure according to claim 6, wherein when the first substrate is butted to the second substrate, the second joint portion is jointed to the fourth joint portion, part of the first annular retaining wall is joined to part of the second annular retaining wall, the first conductive through hole does not overlap the second conductive through hole, the second joint portion, and the fourth joint portion.

11. The circuit board structure according to claim 5, wherein the first conductive through hole comprises a first via, a first conductive material layer, and a first hole-filling material, the first via penetrates through the first dielectric layer, and the first conductive material layer covers an inner wall of the first via and connects the first external circuit layer and the first inner circuit layer electrically, the first hole-filling material fills the first via, and the first inner circuit layer and the first external circuit layer respectively cover a first upper surface and an opposing first lower surface of the first hole-filling material; and the second conductive through hole comprises a second via, a second conductive material layer, and a second hole-filling material, the second via penetrates through the second dielectric layer, and the second conductive material layer covers an inner wall of the second via and connects the second external circuit layer and the second inner circuit layer electrically, the second hole-filling material fills the second via, and the second inner circuit layer and the second external circuit layer respectively cover a second upper surface and an opposing second lower surface of the second hole-filling material.

* * * * *